United States Patent
Borthakur et al.

(10) Patent No.: US 9,947,705 B1
(45) Date of Patent: Apr. 17, 2018

(54) IMAGE SENSORS WITH INFRARED-BLOCKING LAYERS

(71) Applicant: SEMICONDUCTOR COMPONENTS INDUSTRIES, LLC, Phoenix, AZ (US)

(72) Inventors: Swarnal Borthakur, Boise, ID (US); Larry Duane Kinsman, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/276,504

(22) Filed: Sep. 26, 2016

(51) Int. Cl.
*H01L 27/146* (2006.01)

(52) U.S. Cl.
CPC .... *H01L 27/14623* (2013.01); *H01L 27/1464* (2013.01); *H01L 27/1469* (2013.01); *H01L 27/14612* (2013.01); *H01L 27/14634* (2013.01); *H01L 27/14636* (2013.01); *H01L 27/14643* (2013.01); *H01L 27/14685* (2013.01)

(58) Field of Classification Search
CPC ................................................ H01L 27/14623
USPC ..................................... 257/43, 435; 438/71
See application file for complete search history.

(56) References Cited

U.S. PATENT DOCUMENTS

| | | |
|---|---|---|
| 2007/0001094 A1 | 1/2007 | Rhodes |
| 2008/0254565 A1 | 10/2008 | Liu |
| 2009/0302411 A1* | 12/2009 | Massetti ................ B82Y 10/00 257/447 |
| 2012/0008024 A1* | 1/2012 | Takimoto ............ H01L 27/1464 348/294 |
| 2013/0193542 A1 | 8/2013 | Kurogi |
| 2013/0308048 A1* | 11/2013 | Park ...................... H04N 5/2254 348/374 |
| 2015/0054962 A1* | 2/2015 | Borthakur .............. H04N 5/332 348/164 |
| 2015/0054993 A1* | 2/2015 | Borthakur ............ H04N 5/2257 348/262 |
| 2015/0293283 A1* | 10/2015 | Nara ........................ G02B 1/04 348/340 |

(Continued)

OTHER PUBLICATIONS

Frey et al., "On-chip copper-dielectric interference filters for manufacturing of ambient light and proximity CMOS sensors." In Applied Optics, vol. 53, No. 20, pp. 4493-4502. Jul. 10, 2014.

(Continued)

*Primary Examiner* — Igwe U Anya
(74) *Attorney, Agent, or Firm* — Treyz Law Group, P.C.; Zachary D. Hadd

(57) ABSTRACT

An image sensor may include an infrared radiation-blocking layer. The infrared radiation-blocking layer may block infrared radiation from reflecting off of metal layers formed beneath pixel structures in the image sensor so that the reflected light does not reach the photodiodes. The infrared radiation-blocking layer may be formed between a backside redistribution layer and an epitaxial silicon layer in which pixel structures such as photodiodes and transistors are formed. The infrared radiation-blocking layer may be formed from a pre-existing metal layer between the backside redistribution layer and the epitaxial silicon layer. The infrared radiation-blocking layer may prevent the image sensor from generating inadvertent photocurrents in response to reflected infrared light.

21 Claims, 12 Drawing Sheets

(56) References Cited

U.S. PATENT DOCUMENTS

2017/0078539 A1\* 3/2017 Madurawe ........... H04N 5/2253

OTHER PUBLICATIONS

Begou et al., "Optical filters for UV to near IR space applications." In International Conference on Space Optics 2014. Oct. 2014.
Kinsman, Larry D. et al., "Methods and Apparatus for a Thermal Equalizer in an Image Sensor," U.S. Appl. No. 15/268,183, filed Sep. 16, 2016.

\* cited by examiner

US 9,947,705 B1

IMAGE SENSORS WITH INFRARED-BLOCKING LAYERS

BACKGROUND

This relates generally to imaging devices, and more particularly, to imaging devices having pixels with infrared radiation-blocking layers.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode for generating charge in response to light. Circuitry is commonly coupled to each pixel column for reading out image signals from the image pixels.

In certain applications, pixels may be exposed to infrared radiation. Infrared light in the environment may be received by pixels. Components of an imaging device may generate infrared radiation that reaches the pixels. Underlying metal structures in an image sensor such as a backside redistribution layer may reflect infrared light received by the sensor back towards the photodiodes, causing the photodiodes to generate photocurrent in response to light that would not normally be detected. Signals generated in response to infrared light reflected off of metal layers in the image sensor and infrared radiation can cause the sensor to generate a "ghost" image of the underlying metal layers.

It would therefore be desirable to provide imaging systems with infrared radiation-blocking structures.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
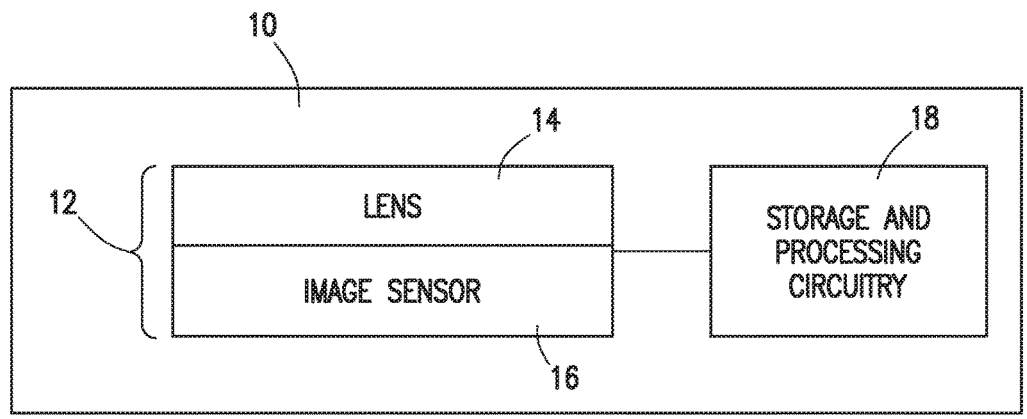
FIG. 1 is a diagram of an illustrative electronic device having an image sensor and processing circuitry for capturing images using a pixel array with multi-port image pixels in accordance with an embodiment of the present invention.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
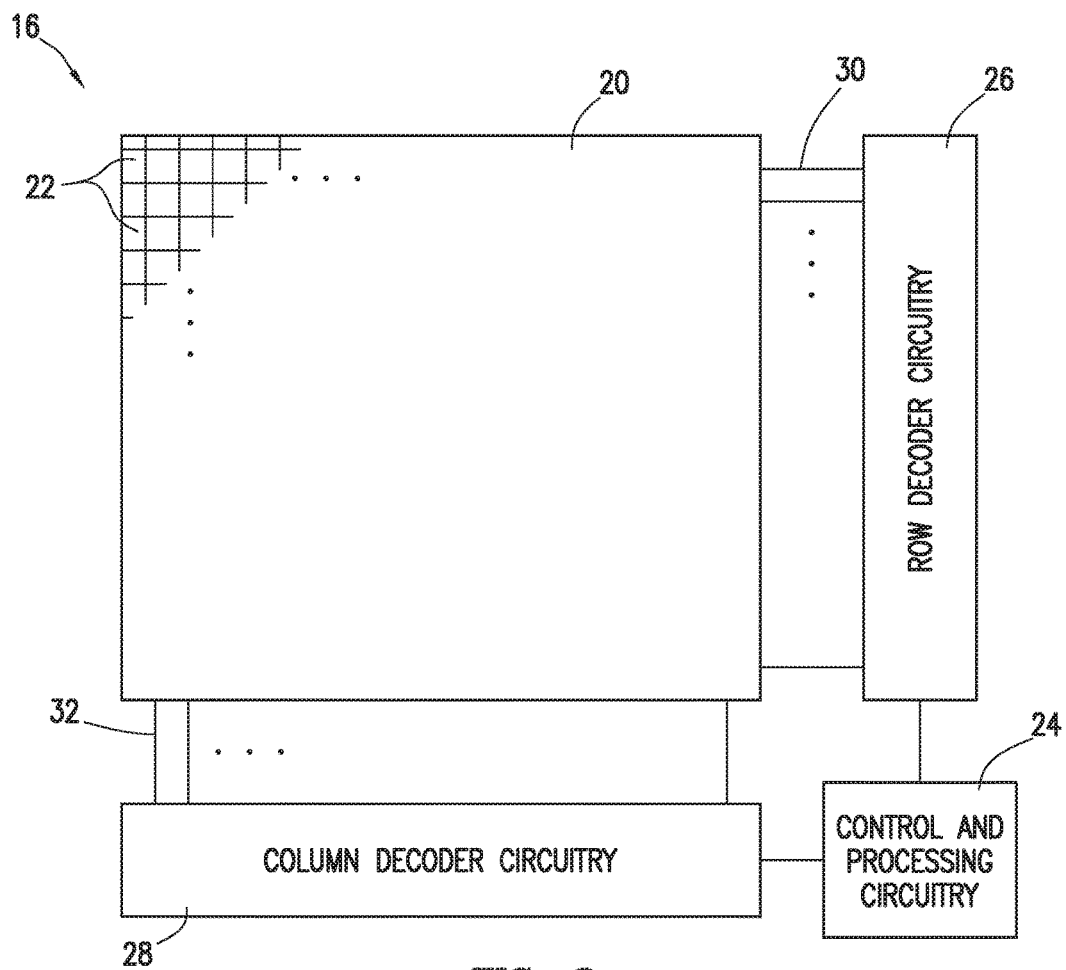
FIG. 2 is a diagram of an illustrative pixel array and associated readout circuitry for reading out image signals from the pixel array in accordance with an embodiment of the present invention.

As shown in FIG. 2, image sensor 16 may include a pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, a color filter array may be formed over photosensitive regions in array 20 so that a desired color filter element in the color filter array is formed over an upper surface of the photosensitive region of an associated pixel 22. A microlens may be formed over an upper surface of the color filter array to focus incoming light onto the photosensitive region associated with that pixel 22. Incoming light may be focused onto the photosensitive region by the microlens and may pass through the color filter element so that only light of a corresponding color is captured at the photosensitive region. If desired, an optional masking layer may be interposed between the color filter element and the microlens for one or more pixels 22 in array 20. In another suitable arrangement, an optional masking layer may be interposed between the color filter element and the photosensitive region for one or more pixels 22 in array 20. The masking layers may include metal masking layers or other filtering layers that block a portion of the image light from being received at the photosensitive region. The masking layers may, for example, be provided to some image pixels 22 to adjust the effective exposure level of corresponding image pixels 22 (e.g., image pixels 22 having masking layers may capture less light relative to image pixels 22 without masking layers). If desired, image pixels 22 may be formed without any masking layers.

If desired, pixels 22 in array 20 of FIG. 2 may be provided with an array of color filter elements that each pass one or more colors of light. All or some of pixels 22 may be provided with a color filter element. Color filter elements for pixels 22 may be red color filter elements (e.g., photoresist material or interference/dichroic/thin-film filter material that passes red light while reflecting and/or absorbing other colors of light), blue color filter elements (e.g., photoresist material that passes blue light while reflecting and/or absorbing other colors of light), and/or green color filter elements (e.g., photoresist material that passes green light while reflecting and/or absorbing other colors of light). Color filter elements may also be configured to filter light that is outside the visible human spectrum. For example, color filter elements may be configured to filter ultraviolet or infrared light (e.g., a color filter element may only allow infrared light or ultraviolet light to reach the photodiode). Color filter elements may configure image pixel 22 to only detect light of a certain wavelength or range of wavelengths (sometimes referred to herein as a wavelength band) and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Magenta color filter elements that are configured to pass red and blue light may be also be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. Image signals generated by broadband image pixels may sometimes be referred to herein as broadband image signals. Broadband image pixels may have a natural sensitivity defined by the material that forms the broadband color filter element and/or the material that forms the image sensor pixel (e.g., silicon). In another suitable arrangement, broadband image pixels may be formed without any color filter elements. The sensitivity of broadband image pixels may, if desired, be adjusted for better color reproduction and/or noise characteristics through use of light absorbers such as pigments. In contrast, "colored" pixel may be used herein to refer to image pixels that are primarily sensitive to one color of light (e.g., red light, blue light, green light, or light of any other suitable color). Colored pixels may sometimes be referred to herein as narrowband image pixels because the colored pixels have a narrower spectral response than the broadband image pixels.

If desired, narrowband pixels and/or broadband pixels that are not configured to be sensitive to infrared light may be provided with color filters incorporating absorbers of NIR radiation. Color filters that block near-infrared light may minimize the impact of infrared light on color reproduction in illuminants containing both visible and infrared radiation.

As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. However, limitations of signal to noise ratio (SNR) that are associated with the Bayer Mosaic pattern make it difficult to reduce the size of image sensors such as image sensor 16. It may therefore be desirable to be able to provide image sensors with an improved means of capturing images. In another suitable example, the green pixels in a Bayer pattern are replaced by broadband image pixels having broadband color filter elements. These examples are merely illustrative and, in general, color filter elements of any desired color and in any desired pattern may be formed over any desired number of image pixels 22.

In one embodiment, image sensor 16 may be a front-side-illuminated image sensor. In a front-side-illuminated image sensor, metal routing structures are formed on the same side of the image sensor through which light is received (i.e., light passes through the inter-metal dielectric layers to reach the photodiodes). The metal routing structures may be formed in an interlayer dielectric layer on the front side of the image sensor. Pixel structures such as photodiodes and transistors may be formed in a layer of epitaxial silicon that is beneath the interlayer dielectric layer. A layer of bulk silicon may be formed beneath the epitaxial silicon layer. A backside redistribution layer may be formed beneath the layer of bulk silicon. A through-silicon via may extend through the epitaxial silicon layer and/or the bulk silicon layer to couple the metal routing structures in the interlayer dielectric layer to the backside redistribution layer. If desired, one or more of the metal layers may be used to form a conductive liner that extends through the through-silicon via. A dielectric or other insulating layer may be formed between the conductive liner and the silicon layer(s) to partially or completely electrically isolate these layers. In this way, metal routing structures at different locations in the image sensor can communicate via the backside redistribution layer.

In another embodiment, image sensor 16 may be a back-side-illuminated image sensor. In a back-side-illuminated image sensor, metal routing structures are formed underneath the layer of epitaxial silicon in which pixel structures such as photodiodes and transistors are formed. In this way, light is received at the photodiodes without passing through the metal routing structure layer beforehand. The metal routing structures may be formed in an interlayer dielectric layer that is formed under the epitaxial silicon layer. A carrier silicon layer may be formed beneath the epitaxial silicon layer and the interlayer dielectric layer. The epitaxial silicon layer and the interlayer dielectric layer may form a first portion of the image sensor. A second portion of the image sensor may be formed from the carrier silicon layer and a backside redistribution layer. The first portion may be bonded to the second portion of the image sensor at a bond line such that the interlayer dielectric layer is interposed between the epitaxial silicon layer and the carrier silicon layer. The backside redistribution layer may be formed behind the first portion of the image sensor and behind the carrier silicon layer such that the carrier silicon layer is interposed between the first portion of the back-side-illuminated image sensor and the redistribution layer. A through-silicon via may extend through the carrier silicon layer and/or a portion of the interlayer dielectric layer to couple the backside redistribution layer to the metal layer in the first portion of the image sensor. If desired, one or more of the metal layers may be used to form a conductive liner that extends through the through-silicon via. A dielectric or other insulating layer may be formed between the conductive liner and the silicon layer(s) to partially or completely electrically isolate these layers.

In yet another embodiment, image sensor 16 may be a stacked-chip image sensor having two or more silicon wafers. A two-wafer stacked-chip image sensor may have an image sensor wafer (chip) and a signal processing wafer (chip) that are stacked on top of each other and overlap. The image sensor chip may include a back-side-illuminated image sensor that includes an epitaxial silicon wafer in which pixel structures such as photodiodes and transistors may be formed. The image sensor chip may also include an interlayer dielectric layer and metal routing structures formed in the interlayer dielectric layer. The signal processing chip may be an application-specific integrated circuit (ASIC) having an ASIC silicon wafer and an interlayer dielectric layer. Additional metal routing structures may be formed in the signal processing chip's interlayer dielectric layer. The signal processing chip may also include a back-side redistribution layer. The ASIC silicon layer may be interposed between the backside redistribution layer and the interlayer dielectric layer of the ASIC wafer. A through-silicon via may extend through the ASIC silicon layer to electrically couple the metal routing structures in the signal processing chip to the backside redistribution layer. One of the metal routing structures may form conductive structures in the via that couple the metal routing structures to the backside redistribution layer. A layer of dielectric material may form a sleeve that surrounds the conductive material in the via to separate the via from the ASIC silicon layer.

In front-side-illuminated, back-side-illuminated, and stacked-chip image sensors similar to those described above, infrared light may pass through the epitaxial silicon layer without being absorbed. When this infrared light reaches the backside redistribution layer, it may be reflected back through the image sensor towards the photodiodes. The epitaxial silicon layer may absorb this reflected light and generate a photocurrent in response to the absorbed light. Because these image signals are due to light reflected from the metal redistribution layer, the photocurrent may generate a "ghost" image of the underlying metal layers in response to the infrared light. Both image sensor pixels that are not specifically configured to detect infrared light, and those that are specifically configured to infrared light, may generate photocurrent in response to the reflected infrared light. Thus, imaging systems that are configured to have increased sensitivity to infrared light and normal imaging systems (e.g., imaging systems that are not configured to have increased sensitivity to infrared wavelengths) may both be susceptible to generating inadvertent photocurrents in response to infrared light.

Infrared radiation-blocking layers (sometimes referred to herein as infrared light-blocking layers, light-blocking layers, infrared wavelength filters, infrared absorbing or absorption layers, and/or infrared interference layers) may be provided in image sensors to block infrared radiation from reaching the photodiodes. In one suitable example, an infrared light-blocking layer may be provided between a metal backside redistribution layer and an epitaxial silicon layer in which photodiodes are formed. This, however, is merely illustrative. Infrared light-blocking layers of the type described herein may be provided at any location within the image sensor, if desired.

In one suitable arrangement, an infrared light-blocking layer may be an infrared light-absorbing layer. Infrared light-absorbing layers may be porous metal layers such as black platinum or black gold, as examples. Black platinum may be formed using a vapor deposition process that provides a flat surface for subsequent wafer bonding. Black gold may be formed by evaporation in a high $N_2$ environment. In another suitable example, metal infrared light-blocking layers may be thin-film layers such as nickel (Ni) or nickel-chromium (NiCr). Thin-film metal layer such as these may be formed using physical vapor deposition, chemical vapor deposition, atomic layer deposition, or other suitable deposition processes.

In another suitable arrangement, an infrared light-blocking layer may be an infrared wavelength interference layer. Infrared light interference layers may include an antireflective coating (ARC) that causes destructive interference of reflected infrared light. Antireflective coatings may be formed of non-conductive materials such as single or multiple dielectric layers. In another suitable example, infrared cut filters (band filters) that prevent transmission of infrared light may be used as infrared light interference layers. Infrared cut filters may be formed of single or multi-layered dielectrics, metal layers, composite layers, and/or combinations of these types of layers. If desired, two or more infrared cut filters that block two or more different wavelengths of light (e.g., two different wavelengths of infrared or other wavelengths of light) may be used together in a single infrared light interference layer. As another example, two or more infrared cut filters having two or more different angular sensitivities (e.g., filters that block light arriving from a given angle(s) while allowing light from another angle(s) to pass) may be used together in a single infrared light interference filter. In general, infrared interference filters may be formed by chemical vapor deposition of oxides (e.g., sequential deposition of multiple oxide layers, or concurrently with metal layers such as silicon nitride and/or copper) and/or physical vapor deposition of layers such as hafnium oxides and/or silicon dioxide.

Figure 3:
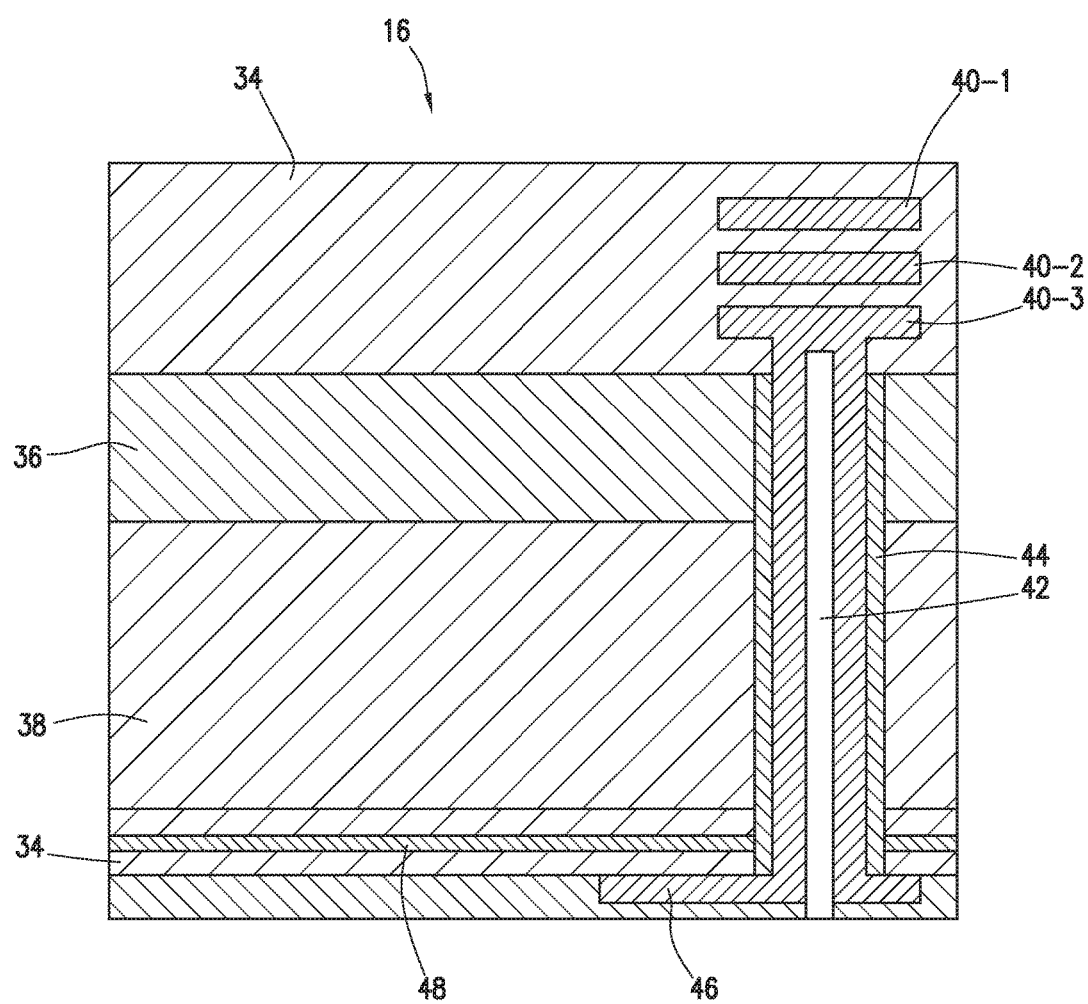
FIG. 3 is a cross-sectional side view of an illustrative front-side-illuminated image sensor having an infrared radiation-blocking layer between a backside redistribution layer and an epitaxial silicon layer in accordance with an embodiment of the present invention.

An illustrative example of a front-side-illuminated image sensor having an infrared light-blocking layer is shown in FIG. 3. As shown in FIG. 3, image sensor 16 may have an epitaxial silicon layer 36. Pixel structures such as photodiodes and transistors may be formed in epitaxial silicon layer 36. Epitaxial silicon layer 36 may be formed between bulk silicon layer 38 and interlayer dielectric layer 34. Metal layers 40-1, 40-2, and 40-3 may form metal routing structures in interlayer dielectric layer 34. A through-silicon via 42 may extend through epitaxial silicon layer 36 and bulk silicon layer 38 to couple one or more of the metal layers to a backside redistribution layer 46. As shown in FIG. 3, metal layer 40-3 may form a conductive sleeve that lines the inner surface of via 42. This, however, is merely illustrative. If desired, metal layer 40-1 and/or metal layer 40-2 may form the conductive liner. A layer of dielectric material may form an insulating sleeve 44 that surrounds the metal that lines the via 42. An infrared light-blocking layer 48 may be formed between backside redistribution layer (RDL) 46 and epitaxial silicon layer 36. In the illustrative example of FIG. 3, infrared light-blocking layer 48 is formed between bulk silicon layer 38 and backside redistribution layer 46. If desired, infrared light-blocking layer 48 may be embedded in an additional layer of dielectric material 34 that separates backside redistribution layer 46 from bulk silicon layer 38. By forming infrared light-blocking layer 48 between epitaxial silicon layer 36 and backside redistribution layer 46, infrared light can be prevented from reaching backside redistribution layer 46, and light that does reach backside redistribution layer 46 from underneath the backside redistribution layer can be blocked and prevented from reaching silicon layer 36. This prevents pixel structures in epitaxial silicon layer 36 from inadvertently generating image signals in response to reflected infrared light.

Figure 4:
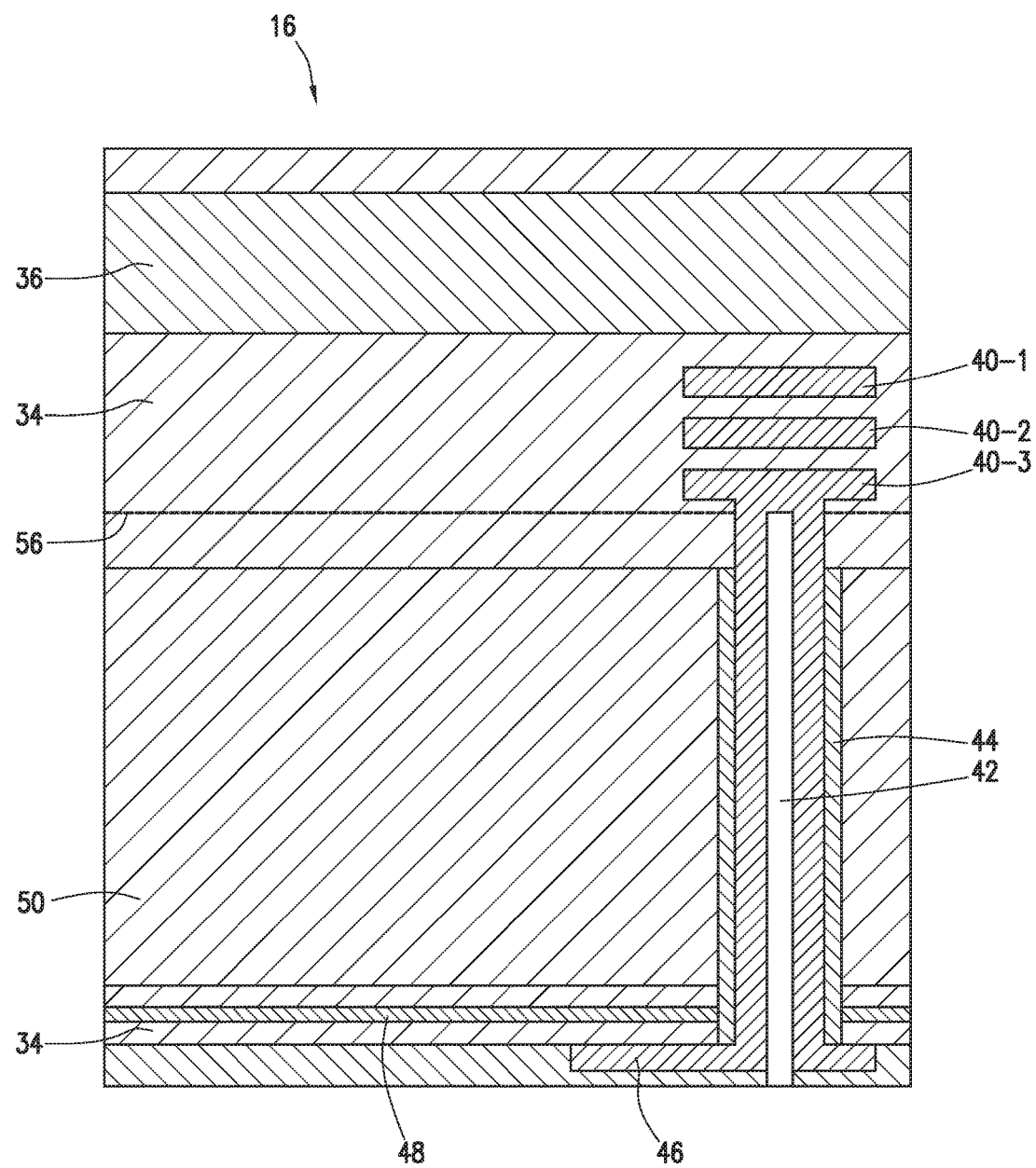
FIG. 4 is a cross-sectional side view of an illustrative back-side-illuminated image sensor having an infrared radiation-blocking layer between a backside redistribution layer and an epitaxial silicon layer in accordance with an embodiment of the present invention.

An illustrative example of a back-side-illuminated image sensor having an infrared light-blocking layer is shown in FIG. 4. As shown in FIG. 4, image sensor 16 may have an epitaxial silicon layer 36. Pixel structures such as photodiodes and transistors may be formed in epitaxial silicon layer 36. Image sensor 16 may have an interlayer dielectric layer 34. Metal layers 40-1, 40-2, and 40-3 may form metal routing structures in interlayer dielectric layer 34. Interlayer dielectric layer 34 may be formed between carrier silicon layer 50 and epitaxial silicon layer 36. The epitaxial silicon layer 36, the interlayer dielectric layer 34, and the metal layers may form a first portion of the image sensor, and the carrier silicon layer 50 and a backside redistribution layer 46 may form a second portion of the image sensor. The first and second portions of the image sensor may be bonded together at a bond line 56. A through-silicon via 42 may extend through carrier silicon layer 50 to couple one or more of the metal layers to a backside redistribution layer 46. As shown in FIG. 4, metal layer 40-3 may form a conductive sleeve that lines the inner surface of via 42. This, however, is merely illustrative. If desired, metal layer 40-1 and/or metal layer 40-2 may form the conductive liner. A layer of dielectric material may form an insulating sleeve 44 that surrounds the metal that lines the via 42.

Infrared light-blocking layer 48 may be formed between backside redistribution layer 46 and epitaxial silicon layer 36. In the illustrative example of FIG. 4, infrared light-blocking layer 48 is formed between carrier silicon layer 50 and backside redistribution layer 46. If desired, infrared light-blocking layer 48 may be embedded in an additional layer of dielectric material 34 that separates backside redistribution layer 46 from carrier silicon layer 50. By forming infrared light-blocking layer 48 between epitaxial silicon layer 36 and backside redistribution layer 46, infrared light can be prevented from reaching backside redistribution layer 46, and light that does reach backside redistribution layer 46 from underneath the backside redistribution layer can be blocked and prevented from reaching silicon layer 36. This prevents pixel structures in epitaxial silicon layer 36 from inadvertently generating image signals in response to reflected infrared light.

Figure 5A:
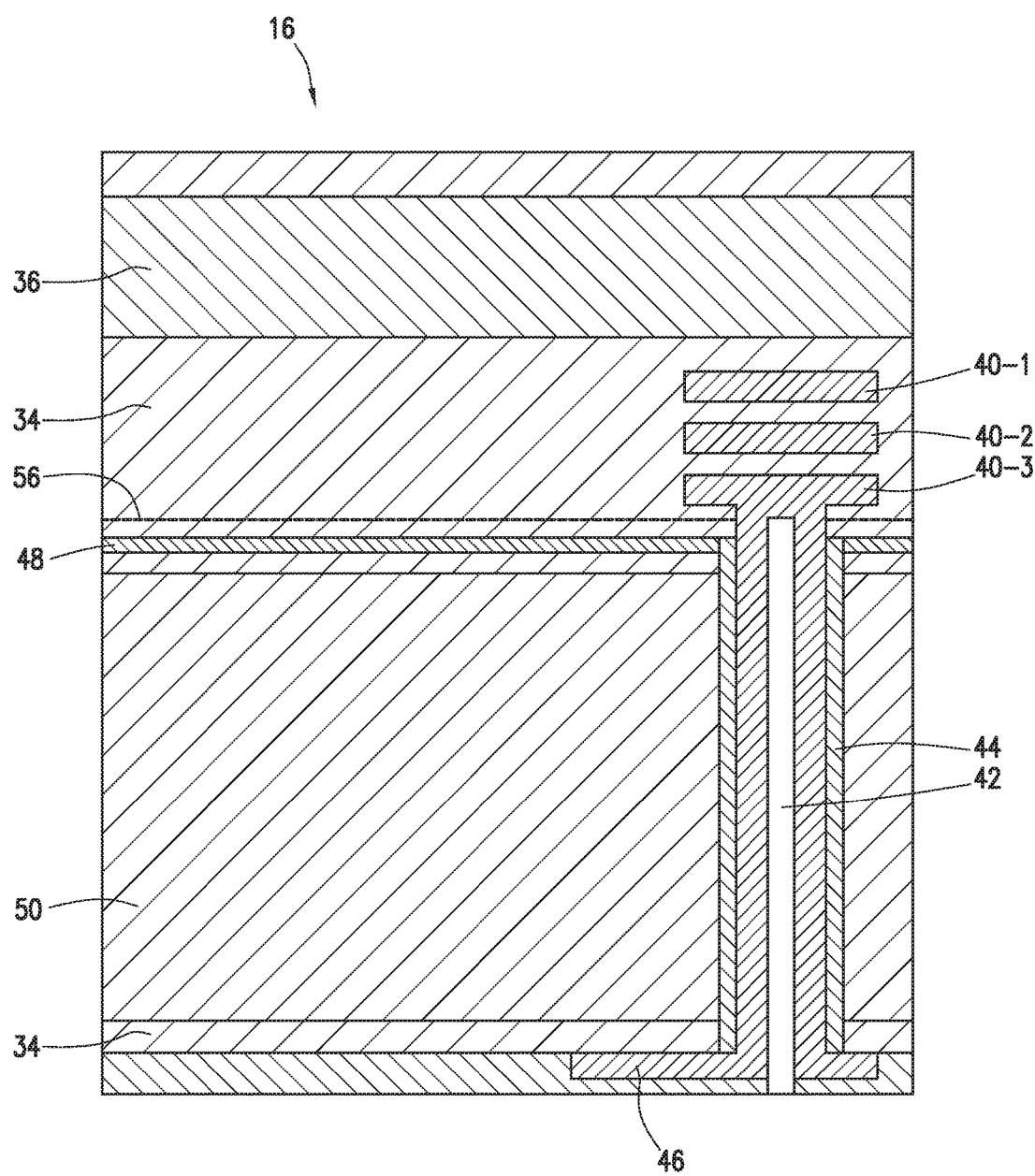
FIGS. 5A and 5B are cross-sectional side views of illustrative back-side-illuminated image sensors having infrared radiation-blocking layers between a carrier silicon layer and an epitaxial silicon layer in accordance with an embodiment of the present invention.

FIG. 5A shows an illustrative back-side-illuminated image sensor. In FIG. 5A, infrared light-blocking layer 48 is formed between backside redistribution layer 46 and epitaxial silicon layer 36. In particular, infrared light-blocking layer 48 is formed in carrier silicon layer 50 such that infrared light-blocking layer 48 is interposed between a portion of carrier silicon layer 50 and interlayer dielectric layer 34. In this way, infrared light-blocking layer 48 is formed on the carrier silicon layer side of image sensor 16 (i.e., infrared light-blocking layer 48 is interposed between bond line 56 and carrier silicon layer 50). Because infrared light-blocking layer 48 is still between epitaxial silicon layer 36 and backside redistribution layer 46, infrared light that approaches epitaxial silicon layer 36 from the opposing side (carrier silicon layer side) of bond line 56 is still blocked and is prevented from generating inadvertent photocurrents in epitaxial silicon layer 36. In this position, infrared light-blocking layer 48 can also block infrared light that passes through epitaxial silicon layer 36 from travelling deeper into the sensor and reaching backside redistribution layer 46 in the first place, further limiting reflections. If desired, an additional interlayer dielectric layer 34 may separate backside redistribution layer 46 from carrier silicon layer 50.

Figure 5B:
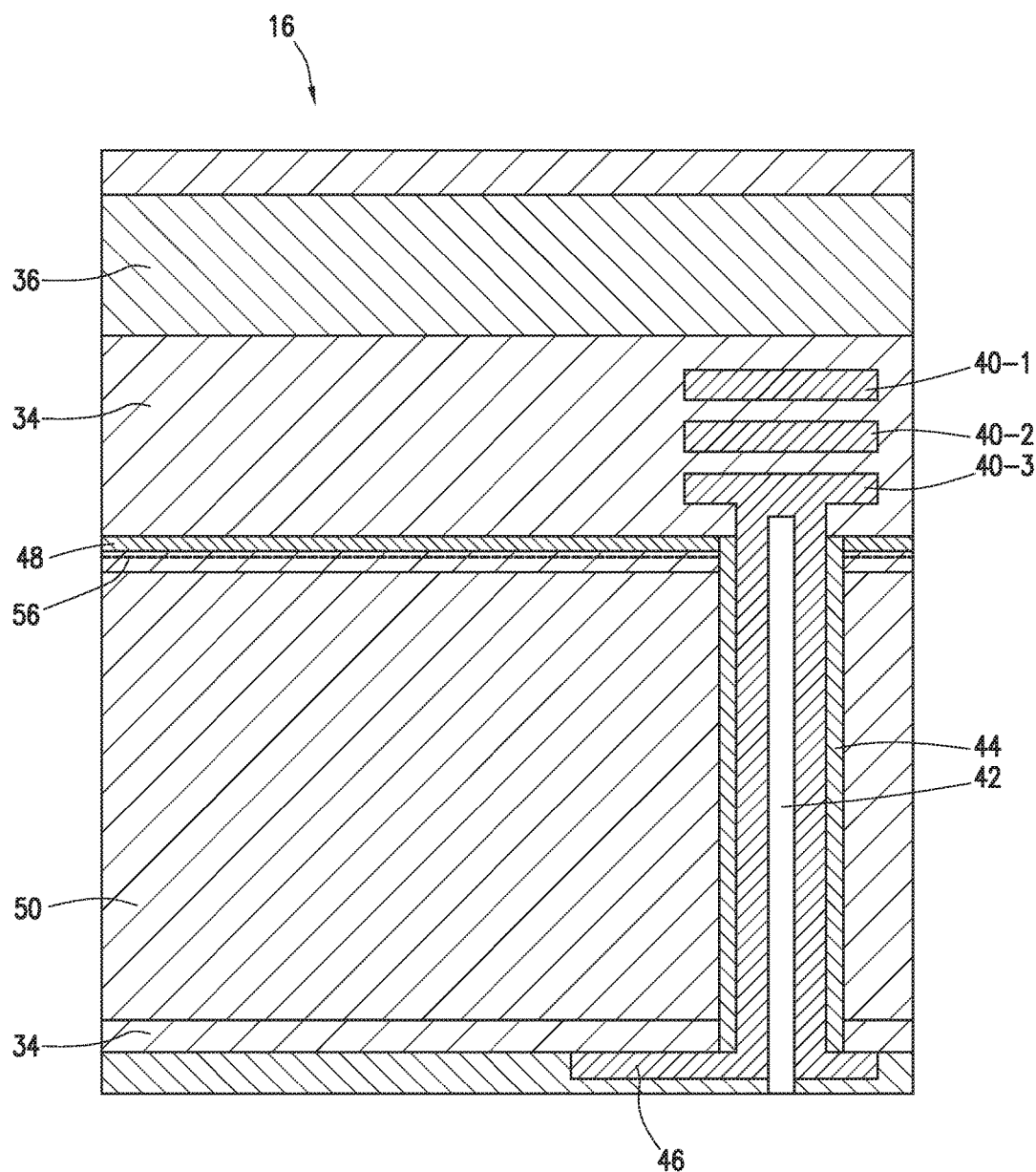
Figure 6:
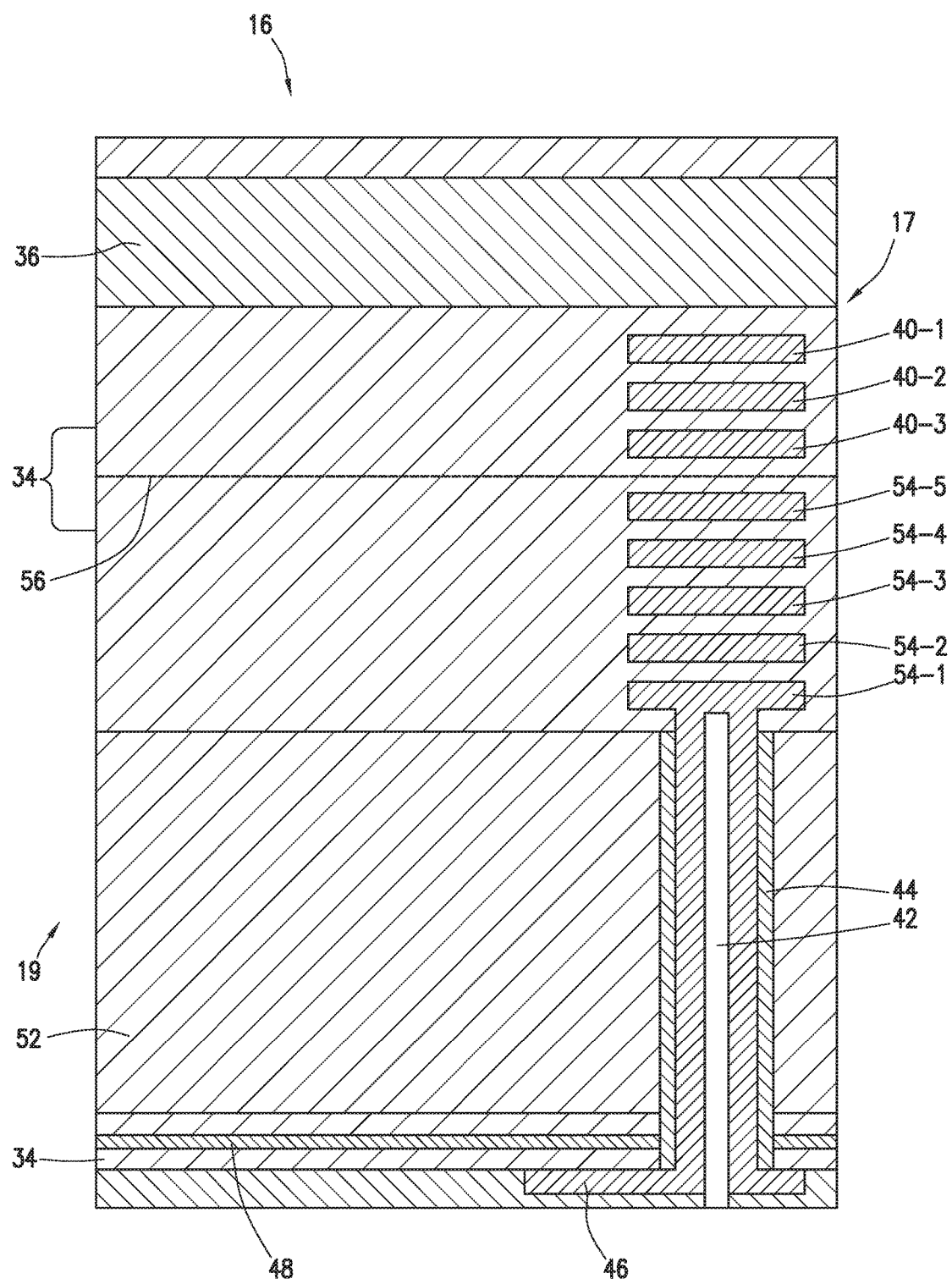
FIG. 6 is a cross-sectional side view of an illustrative stacked-chip image sensor having an infrared radiation-blocking layer between a backside redistribution layer and an epitaxial silicon layer in accordance with an embodiment of the present invention.

FIG. 5B shows an illustrative back-side-illuminated image sensor. In FIG. 5B, infrared light-blocking layer 48 is formed between backside redistribution layer 46 and epitaxial silicon layer 36. In particular, infrared light-blocking layer 48 is formed in interlayer dielectric layer 34 such that infrared light-blocking layer 48 is interposed between a portion of interlayer dielectric layer 34 and carrier silicon layer 50. In this way, infrared light-blocking layer 48 is formed on the epitaxial silicon layer side of image sensor 16 (i.e., infrared light-blocking layer 48 is interposed between bond line 56 and epitaxial silicon layer 36). Because infrared light-blocking layer 48 is still between epitaxial silicon layer 36 and backside redistribution layer 46, infrared light that approaches epitaxial silicon layer 36 from the opposing side (carrier silicon layer side) of bond line 56 is still blocked and is prevented from generating inadvertent photocurrents in epitaxial silicon layer 36. In this position, infrared light-blocking layer 48 can also block infrared light that passes through epitaxial silicon layer 36 from travelling deeper into the sensor and reaching backside redistribution layer 46 in the first place, further limiting reflections. If desired, an additional interlayer dielectric layer 34 may separate backside redistribution layer 46 from carrier silicon layer 50. An illustrative example of a stacked-chip image sensor having an infrared light-blocking layer is shown in FIG. 6. As shown in FIG. 6, stacked-chip image sensor 16 may have an image sensor chip 17 and a processing chip 19. Image sensor chip 16 may include a back-side-illuminated image sensor having an epitaxial silicon layer 36. Pixel structures such as photodiodes and transistors may be formed in epitaxial silicon layer 36. Image sensor chip 17 may have an interlayer dielectric layer 34. Metal layers 40-1, 40-2, and 40-3 may form metal routing structures in interlayer dielectric layer 34.

Processing chip 19 may be an application-specific integrated circuit that includes ASIC silicon wafer 52 and an interlayer dielectric layer 34. Interlayer dielectric layer 34 may include metal layers 54-1, 54-2, 54-3, 54-4, and 54-5. A through-silicon via 42 may extend through integrated circuit silicon layer 52 to couple one or more of the metal layers to a backside redistribution layer 46. ASIC silicon wafer 52 may be interposed between backside redistribution layer 46 and interlayer dielectric layer 34. As shown in FIG. 6, metal layer 54-1 may form a conductive sleeve that lines the inner surface of via 42. This, however, is merely illustrative. If desired, another metal layer in interlayer dielectric layer 34 may form the conductive liner. A layer of dielectric material may form an insulating sleeve 44 that surrounds the metal that lines the via 42. Image sensor chip 17 may be stacked on top of and coupled to processing chip 19 at bond line 56. In the illustrative example of FIG. 6, infrared light-blocking layer 48 is formed in processing chip 19 between ASIC silicon layer 52 and backside redistribution layer 46. If desired, infrared light-blocking layer 48 may be embedded in an additional layer of dielectric material 34 that separates backside redistribution layer 46 from ASIC silicon layer 52.

Figure 7A:
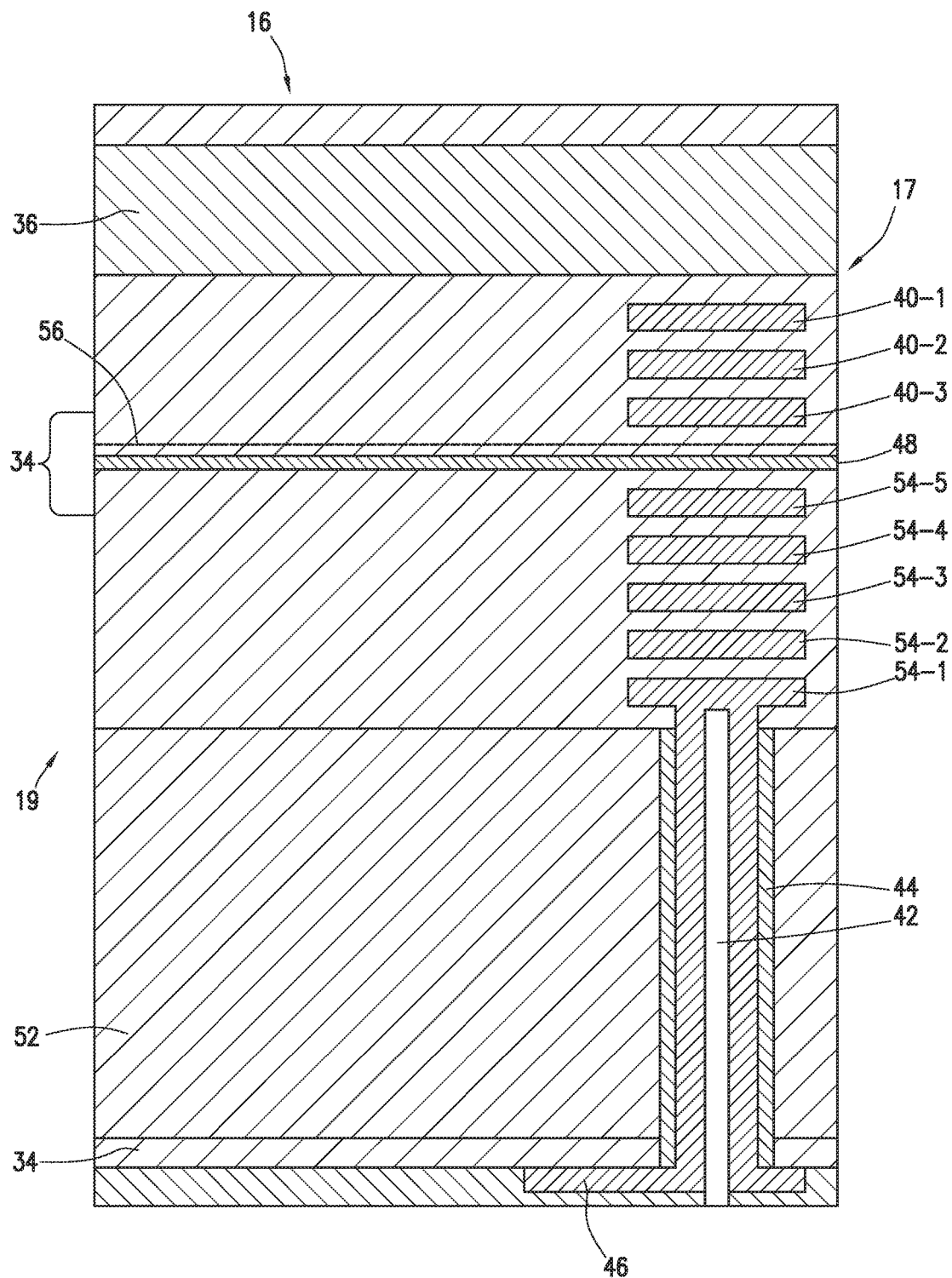
FIGS. 7A and 7B are cross-sectional side views of illustrative two-wafer stacked chip image sensors having infrared radiation-blocking layers between an image sensor chip and a processing circuitry chip in accordance with an embodiment of the present invention.

In the illustrative example of FIG. 7A, infrared light-blocking layer 48 is formed in processing chip 19 in interlayer dielectric layer 34 (i.e., on the processing chip side of bond line 56). In particular, infrared light-blocking layer 48 is formed in interlayer dielectric layer 34 such that infrared light-blocking layer 48 is interposed between a portion of interlayer dielectric layer 34 and metal layer 54-5. In this way, infrared light-blocking layer 48 is formed on the ASIC silicon layer side of image sensor 16 (i.e., infrared light-blocking layer 48 is interposed between bond line 56 and a portion of interlayer dielectric layer 34). Because infrared light-blocking layer 48 is still between epitaxial silicon layer 36 and backside redistribution layer 46, infrared light that approaches epitaxial silicon layer 36 from the opposing side (ASIC silicon layer side) of bond line 56 is still blocked and is prevented from generating inadvertent photocurrents in epitaxial silicon layer 36. In this position, infrared light-blocking layer 48 can also block infrared light that passes through epitaxial silicon layer 36 from travelling deeper into the sensor and reaching backside redistribution layer 46 in the first place, further limiting reflections. If desired, an additional interlayer dielectric layer 34 may separate backside redistribution layer 46 from ASIC silicon layer 52.

Figure 7B:
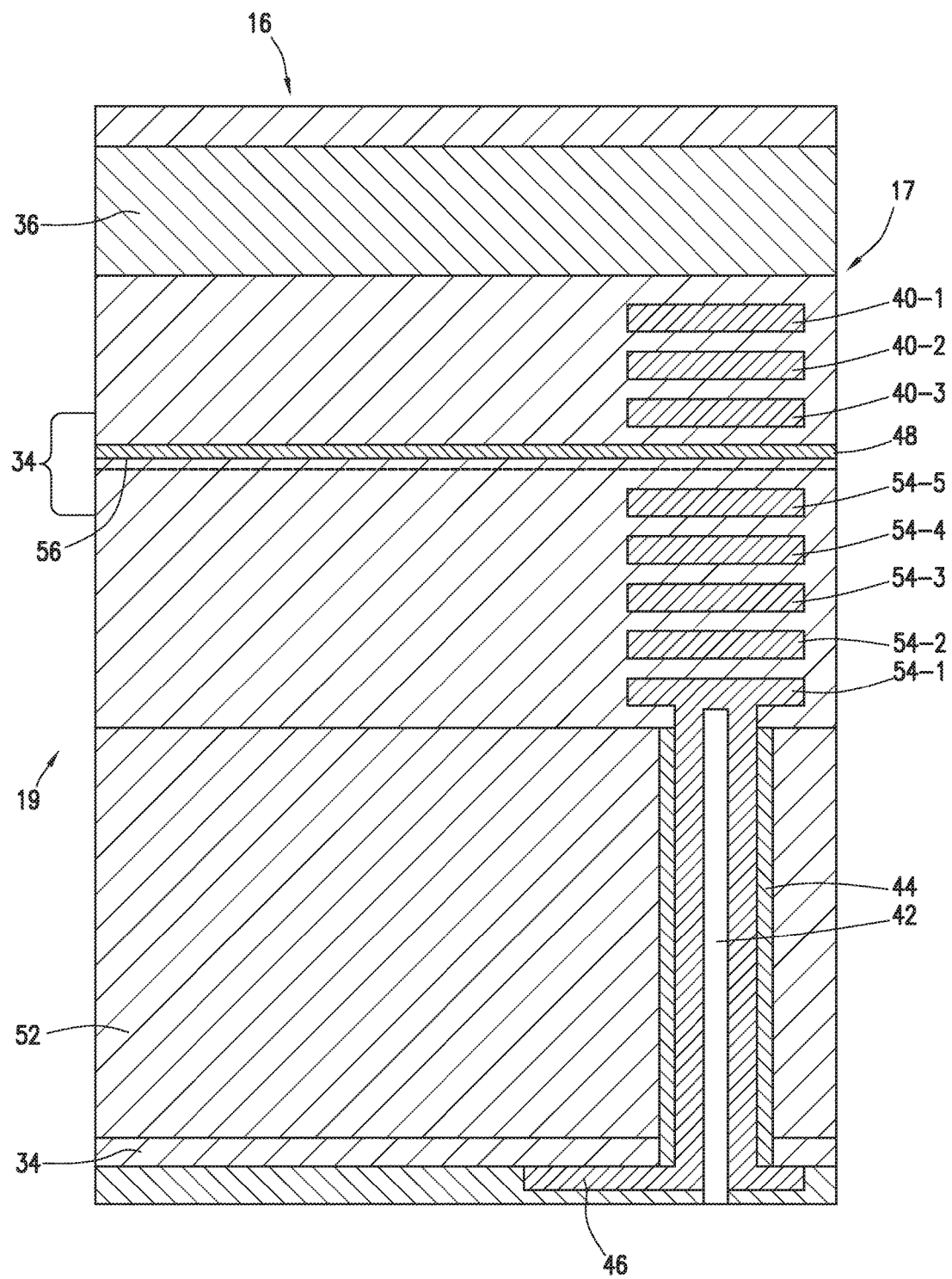

In the illustrative example of FIG. 7B, infrared light-blocking layer 48 is formed in image sensor chip 17 in interlayer dielectric layer 34 (i.e., on the image sensor chip side of bond line 56). In particular, infrared light-blocking layer 48 is formed in interlayer dielectric layer 34 such that infrared light-blocking layer 48 is interposed between a portion of interlayer dielectric layer 34 and epitaxial silicon layer 36. In this way, infrared light-blocking layer 48 is formed on the image sensor silicon layer side of image sensor 16 (i.e., infrared light-blocking layer 48 is interposed between bond line 56 and metal layer 54-3). Because infrared light-blocking layer 48 is still between epitaxial silicon layer 36 and backside redistribution layer 46, infrared light that approaches epitaxial silicon layer 36 from the opposing side (ASIC silicon layer side) of bond line 56 is still blocked and is prevented from generating inadvertent photocurrents in epitaxial silicon layer 36. In this position, infrared light-blocking layer 48 can also block infrared light that passes through epitaxial silicon layer 36 from travelling deeper into the sensor and reaching backside redistribution layer 46 in the first place, further limiting reflections. If desired, an additional interlayer dielectric layer 34 may separate backside redistribution layer 46 from ASIC silicon layer 52.

Figure 7C:
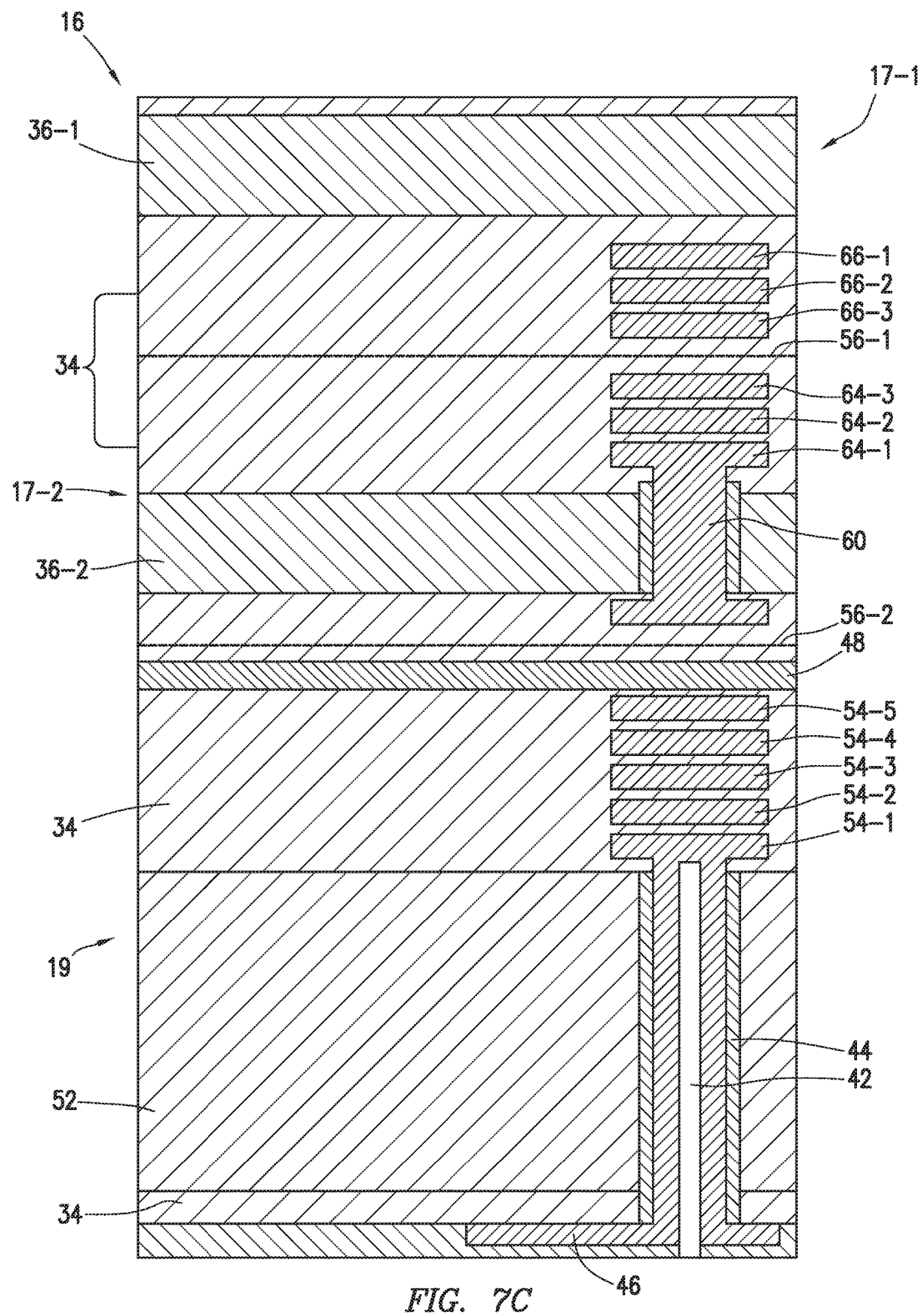
FIG. 7C is a cross-sectional side view of an illustrative three-wafer stacked chip image sensor having an infrared radiation-blocking layer and a transistor silicon layer between a photodiode silicon layer and an integrated circuit layer in accordance with an embodiment of the present invention.

In the stacked-chip image sensor 16 of FIG. 7C, image sensor chip 17 has been formed as separate portions including a photodiode chip 17-1 and a transistor chip 17-2. Photodiode chip 17-1 includes an epitaxial silicon layer 36-1 in which photodiodes are formed and an interlayer dielectric layer 34 in which metal layers 66-1, 66-2, and 66-3 are formed. Transistor chip 17-2 includes an epitaxial silicon layer 36-2 in which transistors are formed and an interlayer dielectric layer 34 in which metal layers 64-1, 64-2, and 64-3 are formed. Transistor chip 17-2 may also include a through-silicon via 60 that couples one or more of the metal layers to other metal layers in the image sensor. Photodiode chip 17-1 may be coupled to transistor chip 17-2 at bond line 56-1 such that both of the interlayer dielectric layers 34 are interposed between photodiode silicon layer 36-1 and transistor silicon layer 36-2. In the illustrative example of FIG. 7C, ASIC chip 19 is bonded to transistor chip 17-2 at bond line 56-2 such that transistor chip 17-2 is interposed between photodiode chip 17-1 and ASIC chip 19.

In the illustrative example of FIG. 7C, stacked chip image sensor 16 includes infrared light-blocking layer 48 in ASIC chip 19. In particular, infrared light-blocking layer 48 is interposed between a portion of interlayer dielectric layer 34 and transistor silicon layer 36-2 such that infrared light-blocking layer 48 is formed on the ASIC silicon layer side of bond line 56. This, however is merely illustrative.

If desired, infrared light-blocking layer 48 may be formed in transistor chip 17-2. In such an arrangement, layer 48 may be interposed between a portion of interlayer dielectric layer 34 and transistor silicon layer 36-2 such that light-blocking layer 48 is formed on the transistor silicon layer side of bond line 56.

If desired, infrared light-blocking layer 48 may be formed in transistor chip 17-2. In such an arrangement, layer 48 may be interposed between a portion of transistor silicon layer 36-2 and photodiode silicon layer 36-1 (e.g., between the interlayer dielectric layer 34 in photodiode chip 17-1 and the interlayer dielectric layer 34 in transistor chip 17-2) such that light-blocking layer 48 is formed on the transistor silicon layer side of bond line 56.

If desired, infrared light-blocking layer 48 may be formed in photodiode chip 17-1. In such an arrangement, layer 48 may be interposed between a portion of transistor silicon layer 36-2 and photodiode silicon layer 36-1 (e.g., between the interlayer dielectric layer 34 in photodiode chip 17-1 and the interlayer dielectric layer 34 in transistor chip 17-2) such that light-blocking layer 48 is formed on the photodiode silicon layer side of bond line 56.

In each of the positions for infrared light-blocking layer 48 described above in connection with FIG. 7C, infrared light-blocking layer 48 can also block infrared light that passes through photodiode silicon layer 36-1 and/or transistor silicon layer 36-2 from travelling deeper into the sensor and reaching backside redistribution layer 46 in the first place, further limiting reflections. If desired, an additional interlayer dielectric layer 34 may separate backside redistribution layer 46 from ASIC silicon layer 52.

In the examples described above in connection with FIGS. 3, 4, 5A, 5B, 6, 7A, 7B, and 7C, only one infrared light-blocking layer 48 is shown. This, however, is merely illustrative. If desired, more than one infrared light-blocking layer 48 may be formed in a given image sensor. For example, two overlapping infrared light-blocking layers 48 may be formed in the same layer of image sensor 16 (e.g., two infrared light-blocking layers 48 in a given interlayer dielectric layer 34), or in two different layers in image sensor 16 (e.g., two different interlayer dielectric layers 34). In examples relating to stacked-chip image sensors, one or more infrared light-blocking layers 48 may be formed in each of the chips in the stacked-chip image sensor. When multiple infrared light-blocking layers 48 are formed in a single image sensor, each of the infrared light-blocking layers 48 may have similar or the same properties (e.g., may have the same optical density to allow the same amount of light to pass, may both be light-absorbing layers, may both be interference-based layers, etc.). In another example, the two or more infrared light-blocking layers 48 may have different properties. For example, each layer may have different optical densities to block different amounts of light, or one layer may be an interference-based light blocking layer, while another layer is a light-absorbing layer (as examples).

The examples described above in connection with FIGS. 3, 4, 5A, 5B, 6, 7A, 7B, and 7C describe image sensors 16 that include through-silicon vias 42 and a backside redistribution layer 46. This, however, is merely illustrative. If desired, an infrared radiation blocking layer 48 may be used in image sensors that do not include through-silicon vias and/or backside redistribution layers. For example, an infrared radiation blocking layer 48 may be incorporated into a chip-on-board (COB) image sensor that may not include a backside redistribution layer. An infrared radiation blocking layer 48 may also be used in image sensors 16 that are electrically coupled to another chip or a circuit board to which the chip is mounted using wire bonding instead through-silicon vias 42. When infrared light-blocking layer 48 is used in image sensors that do not include a backside redistribution layer and/or vias, infrared light that passes through the silicon layer in which the photodiodes are formed can be blocked from traveling deeper into the image sensor die, reducing or eliminating the possibility of reflections from other underlying reflective layers.

Figure 8:
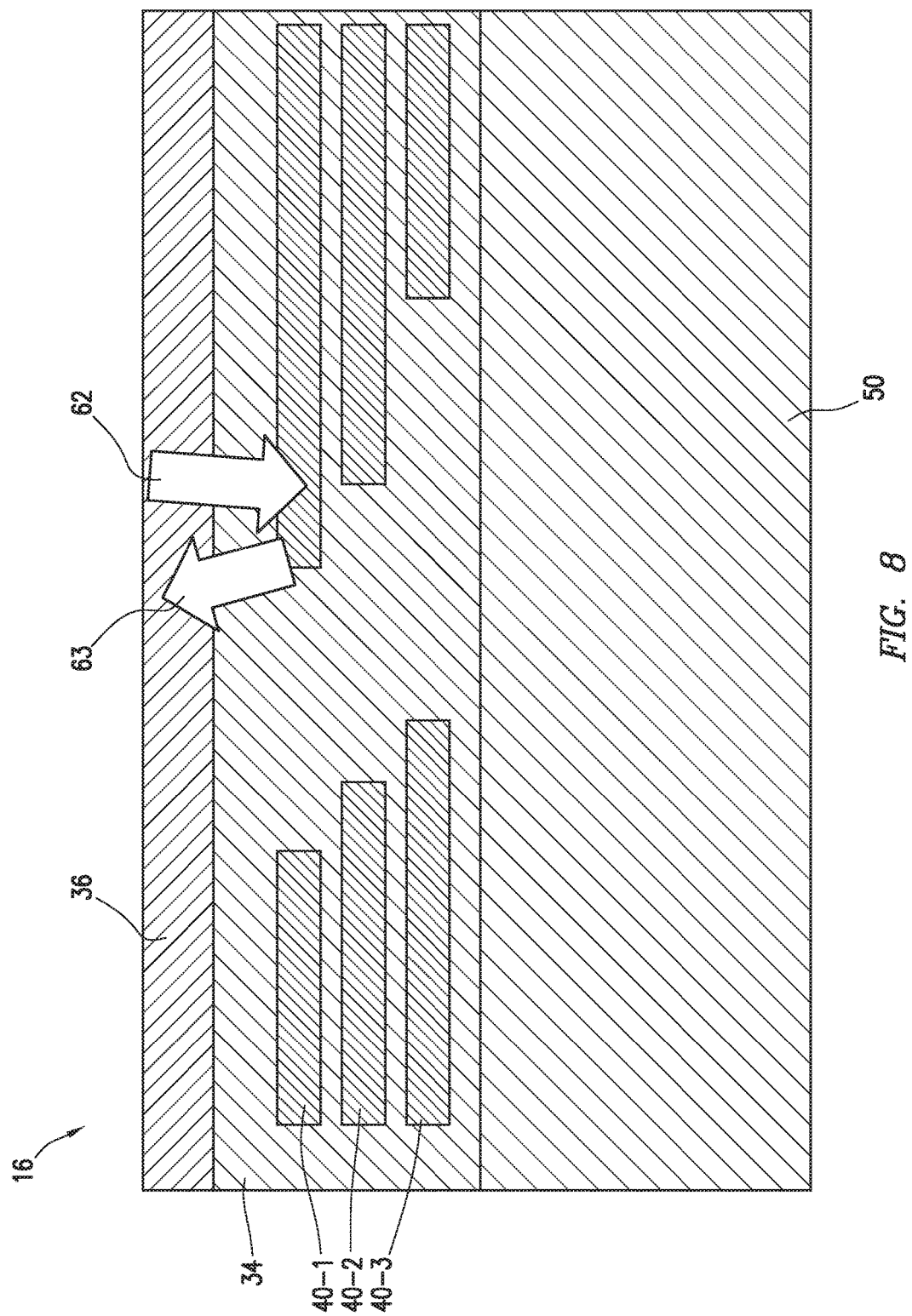
FIG. 8 is a cross-sectional side view of an illustrative back-side-illuminated image sensor having metal layers that may be used to form an infrared radiation-blocking layer in accordance with an embodiment of the present invention.

An illustrative example of infrared light reflecting off of metal layers in a back-side-illuminated image sensor is shown in FIG. 8. The illustrative back-side illuminated image sensor 16 includes a carrier silicon layer 50, an interlayer dielectric layer 34 with metal layers 40-1, 40-2, and 40-3 embedded therein, and an epitaxial silicon layer 36 in which pixel structures such as photodiodes and transistors may be formed. FIG. 8 shows infrared light 62 passing through epitaxial silicon layer 36, reflecting off of metal layer 40-1, and reflecting back towards epitaxial silicon layer 36 as reflected infrared light 63. Reflected infrared light 63 may cause photodiodes in epitaxial silicon layer 36 to generate a ghost image of the pattern of the metal layers that reflect infrared light 63. Although FIG. 8 shows infrared light 62 reflecting off of metal layer 40-1, this is merely illustrative. Infrared light 62 may pass through gaps between the metal layers (i.e., the gaps between the portions of the metal layers shown in FIG. 8). These gaps may be formed beneath photodiodes in epitaxial silicon layer 36 such that light can pass through the epitaxial silicon layer and reflect off of lower metal layers or a backside redistribution layer 46, and then reflect back towards the photodiodes through the gaps.

If desired, one or more of the metal layers in interlayer dielectric layer 34 may be used to form a metal pattern that covers gaps between other metal layers in interlayer dielectric layer 34. In the illustrative example of FIG. 9, metal layer 40-4 has been used to form an array of light-blocking structures that overlap gaps in metal layers 40-1, 40-2, and 40-3. Light-blocking structures 40-4 may be formed directly beneath photodiodes in epitaxial silicon layer 36 such that infrared light that passes through epitaxial silicon layer 36 may be blocked from reflecting off of other metal layers in interlayer dielectric layer 34, and/or the metal in backside redistribution layer 46.

Figure 9:
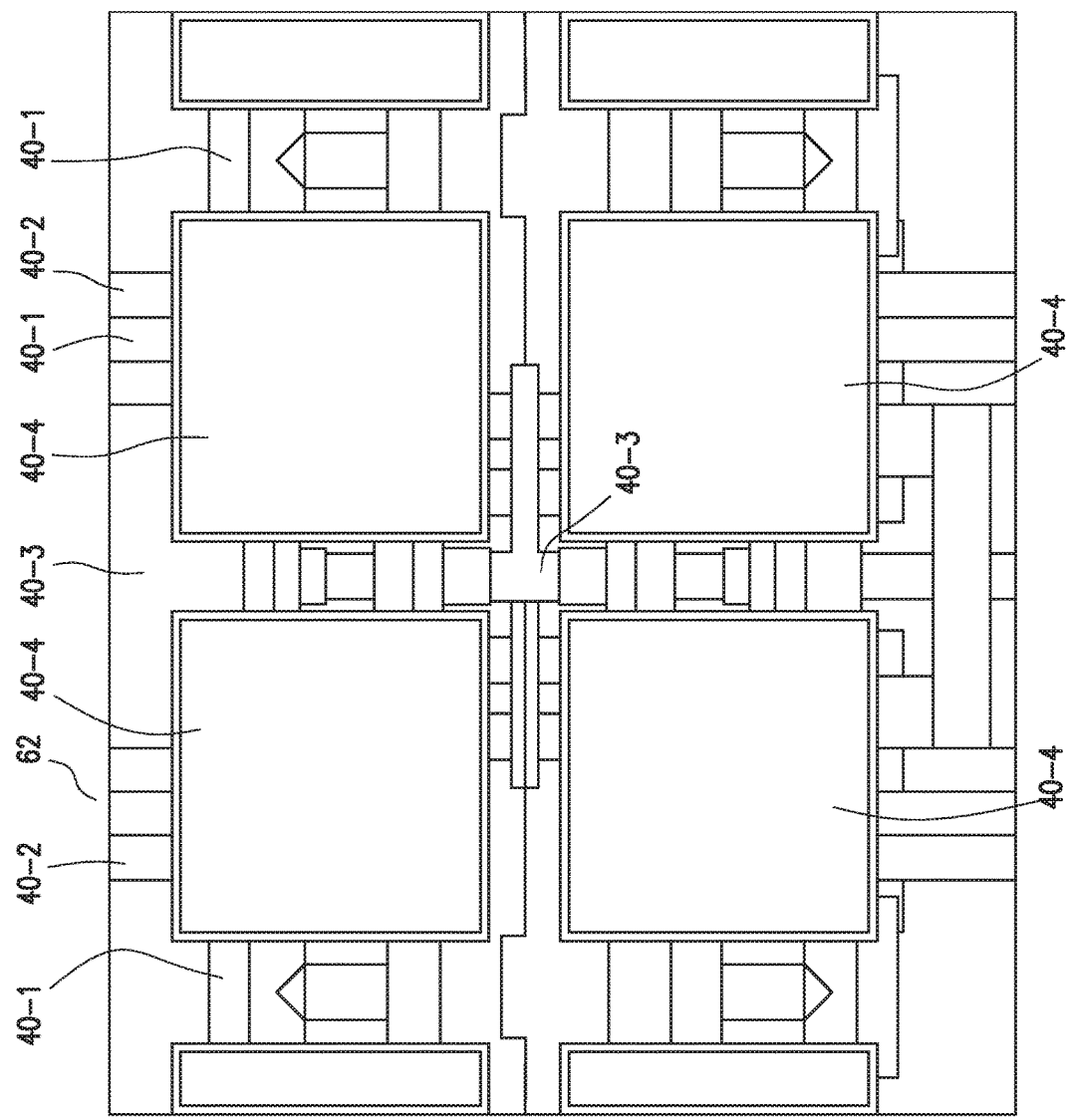
FIG. 9 is a bottom view of an illustrative back-side illuminated image sensor having an infrared radiation-blocking layer formed from a metal layer in the image sensor in accordance with an embodiment of the present invention.

Although metal layer 40-4 is used to form the metal light-blocking pattern in FIG. 9, this is merely illustrative. In some scenarios, it may be desirable to use the metal layer closest to epitaxial silicon layer 36 to form the metal light-blocking pattern. When metal layer 40-4 is used to form the light-blocking structures, higher metal layers (e.g., metal layers 40-1, 40-2, and/or 40-3) may still be capable of reflecting infrared light back towards epitaxial silicon layer 36. By using a higher metal layer (e.g., metal layer 40-1 or metal layer 40-2), the number of metal layers off of which infrared light can reflect may be minimized.

A method of forming an image sensor having an infrared radiation-blocking layer may include forming a metal backside redistribution layer, forming a silicon layer over the metal backside redistribution layer, forming an interlayer dielectric layer over the silicon layer; forming metal layers in the interlayer dielectric layer, forming an epitaxial silicon layer that forms photodiodes for the pixels over the interlayer dielectric layer, and forming the infrared radiation-blocking layer between the metal backside redistribution layer and the epitaxial silicon layer.

In examples in which the image sensor is a back-side-illuminated image sensor, the method may include forming the interlayer dielectric layer, the epitaxial silicon layer, and the metal layers as a first portion of the image sensor. The metal backside redistribution layer, the silicon layer, and the infrared radiation-blocking layer may be formed as a second portion of the image sensor. The back-side-illuminated image sensor may be formed by bonding the first portion to the second portion.

In examples in which the image sensor is a stacked-chip image sensor, the method may include forming an image sensor chip that includes the interlayer dielectric layer, the epitaxial silicon layer, and the metal layers. A processing circuitry chip including the metal backside redistribution layer, the silicon layer, an additional interlayer dielectric layer, additional metal layers in the additional interlayer dielectric layer, and the infrared radiation-blocking layer may also be formed. The stacked-chip image sensor may be formed by bonding the image sensor chip to the processing circuitry chip.

Figure 10:
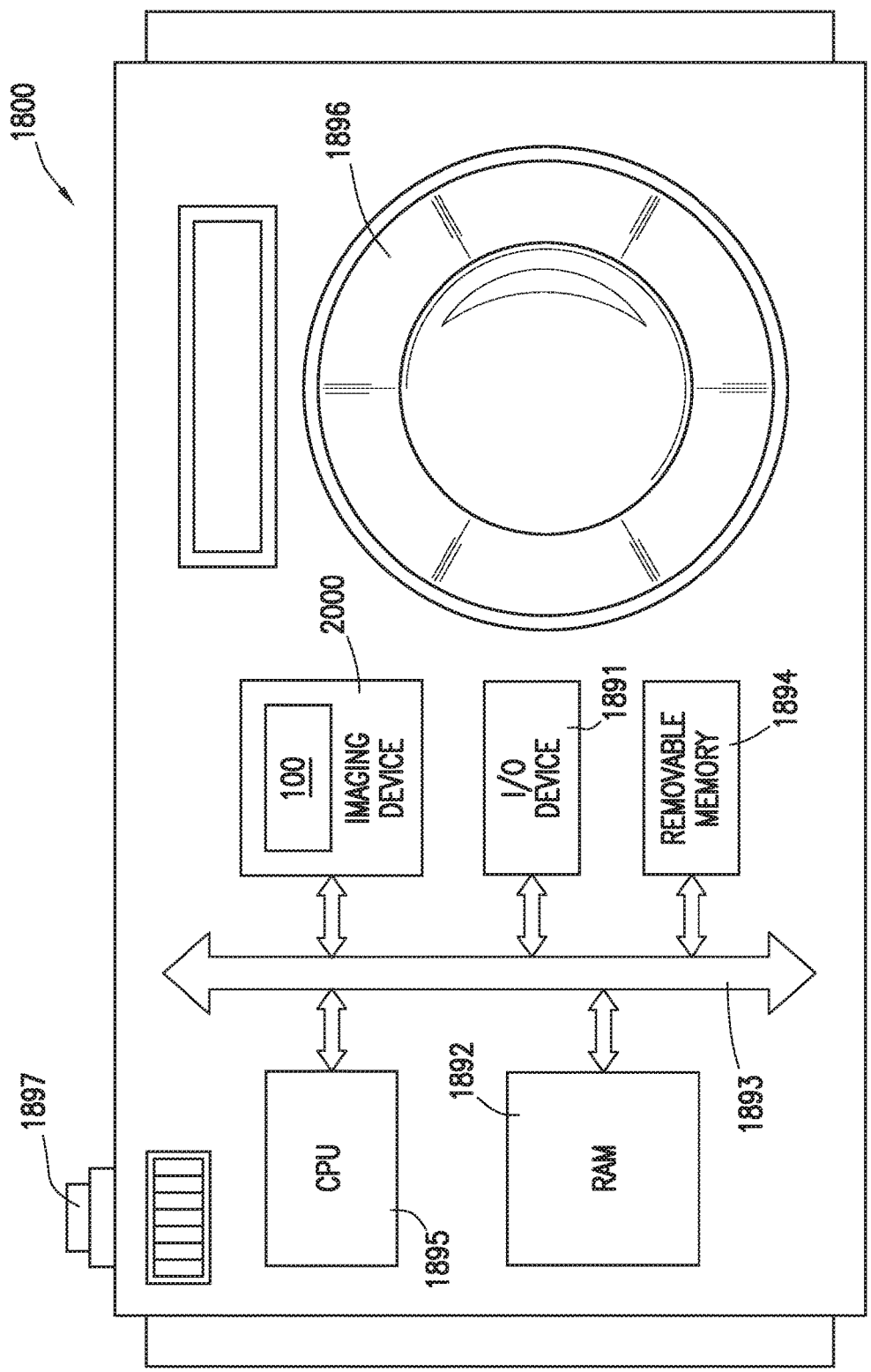
FIG. 10 is a block diagram of an illustrative processor system employing the embodiments of FIGS. 1-9 in accordance with an embodiment of the present invention.

FIG. 10 shows in simplified form a typical processor system 1800, such as a digital camera, which includes an imaging device 2000 (e.g., an imaging device 2000 such as image sensor 16 of FIGS. 1-9 employing image pixel array 100 having an infrared light-blocking layer 48). The processor system 1800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 1800 generally includes a lens 1896 for focusing an image on pixel array 100 of device 2000 when a shutter release button 1897 is pressed, central processing unit (CPU) 1895, such as a microprocessor which controls camera and one or more image flow functions, which communicates with one or more input/output (I/O) devices 1891 over a bus 1893. Imaging device 2000 also communicates with the CPU 1895 over bus 1893. The system 1800 also includes random access memory (RAM) 1892 and can include removable memory 1894, such as flash memory, which also communicates with CPU 1895 over the bus 1893. Imaging device 2000 may be combined with the CPU, with or without memory storage on a single integrated circuit or on a different chip. Although bus 1893 is illustrated as a single bus, it may be one or more busses or bridges or other communication paths used to interconnect the system components.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor having an array of pixels, the image sensor comprising:
   an epitaxial silicon layer that forms photodiodes for the pixels;
   an interlayer dielectric layer;
   metal layers formed in the interlayer dielectric layer;
   an additional silicon layer;
   a metal backside redistribution layer;
   a through-silicon via that extends through the additional silicon layer and couples the metal layers to the metal backside redistribution layer; and
   a metal infrared radiation-blocking layer interposed between the metal backside redistribution layer and the epitaxial silicon layer, wherein the metal infrared radiation-blocking layer is configured to not reflect infrared light.

2. The image sensor defined in claim 1, wherein the interlayer dielectric layer is interposed between the additional silicon layer and the epitaxial silicon layer.

3. The image sensor defined in claim 2, wherein the image sensor is a back-side-illuminated image sensor, and wherein the additional silicon layer is a carrier silicon layer that is interposed between the metal backside redistribution layer and the interlayer dielectric layer.

4. The image sensor defined in claim 3, wherein the metal infrared radiation-blocking layer is interposed between the metal backside redistribution layer and the carrier silicon layer.

5. The image sensor defined in claim 3, wherein the metal infrared radiation-blocking layer is interposed between the carrier silicon layer and the interlayer dielectric layer.

6. The image sensor defined in claim 3, wherein one of the metal layers forms the metal infrared radiation-blocking layer.

7. The image sensor defined in claim 2, wherein the image sensor is a stacked-chip image sensor comprising:
   a first chip comprising the epitaxial silicon layer, the interlayer dielectric layer, and the metal layers; and
   a second chip comprising the additional silicon layer, an additional interlayer dielectric layer, additional metal layers in the additional interlayer dielectric layer, and the through-silicon via, wherein the additional interlayer dielectric layer is interposed between the epitaxial silicon layer and the metal backside redistribution layer.

8. The image sensor defined in claim 7, wherein the metal infrared radiation-blocking layer is interposed between the metal backside redistribution layer and the additional silicon layer.

9. The image sensor defined in claim 7, wherein the metal infrared radiation-blocking layer is interposed between the epitaxial silicon layer and the additional silicon layer.

10. The image sensor defined in claim 9, wherein both the interlayer dielectric layer and the additional dielectric layer are interposed between the epitaxial silicon layer and the additional silicon layer, and wherein the metal infrared radiation-blocking layer is interposed between the interlayer dielectric layer and the additional interlayer dielectric layer.

11. The image sensor defined in claim 7 further comprising:
   a third chip interposed between the first chip and the second chip, the third chip comprising:
     a transistor silicon layer that forms transistors for the photodiodes in the epitaxial silicon layer;
     an interlayer dielectric layer;
     metal layers in the interlayer dielectric layer; and
     an additional through-silicon via coupled to the metal layers in the third chip that extends through the transistor silicon layer, wherein the metal infrared radiation-blocking layer is interposed between the additional silicon layer and the epitaxial silicon layer.

12. The image sensor defined in claim 11, wherein the metal infrared radiation-blocking layer is interposed between the additional silicon layer and the transistor silicon layer.

13. The image sensor defined in claim 11, wherein the metal infrared radiation-blocking layer is interposed between the epitaxial silicon layer and the transistor silicon layer.

14. The image sensor defined in claim 1, wherein the additional silicon layer is interposed between the epitaxial silicon layer and the metal backside redistribution layer, and wherein the metal infrared radiation-blocking layer is interposed between the metal backside redistribution layer and the additional silicon layer.

15. A method of forming an image sensor, comprising:
forming a metal backside redistribution layer;
forming a silicon layer over the metal backside redistribution layer;
forming an interlayer dielectric layer over the silicon layer;
forming metal layers in the interlayer dielectric layer;
forming an epitaxial silicon layer that forms photodiodes for the pixels over the interlayer dielectric layer; and
forming a metal infrared radiation-blocking layer between the metal backside redistribution layer and the epitaxial silicon layer, wherein the metal infrared radiation-blocking layer is configured to not reflect infrared light.

16. The method defined in claim 15, further comprising:
forming the interlayer dielectric layer, the epitaxial silicon layer, and the metal layers as a first portion of the image sensor;
forming the metal backside redistribution layer, the silicon layer, and the metal infrared radiation-blocking layer as a second portion of the image sensor; and
bonding the first portion to the second portion to form a back-side-illuminated image sensor.

17. The method defined in claim 15, further comprising:
forming an image sensor chip comprising the interlayer dielectric layer, the epitaxial silicon layer, and the metal layers;
forming a processing circuitry chip comprising the metal backside redistribution layer, the silicon layer, an additional interlayer dielectric layer, additional metal layers in the additional interlayer dielectric layer, and the metal infrared radiation-blocking layer; and
bonding the image sensor chip to the processing circuitry chip to form a stacked-chip image sensor.

18. The method defined in claim 15, wherein the silicon layer is formed between the epitaxial silicon layer and the metal backside redistribution layer, and wherein the metal infrared radiation-blocking layer is formed between the metal backside redistribution layer and the silicon layer.

19. A system, comprising:
a central processing unit;
memory;
input-output circuitry; and
an image sensor comprising:
an epitaxial silicon layer that forms photodiodes for the pixels;
an additional silicon layer;
an interlayer dielectric layer interposed between the epitaxial silicon layer and the additional silicon layer; and
a metal infrared light-blocking layer that is formed in the interlayer dielectric layer and interposed between the epitaxial silicon layer and the additional silicon layer, wherein the metal infrared light-blocking layer is configured to not reflect infrared light.

20. The system defined in claim 19, wherein the image sensor is a back-side-illuminated image sensor.

21. The system defined in claim 19, wherein the image sensor is a stacked-chip image sensor comprising an image sensor wafer and a processing circuitry wafer.

* * * * *